(12) United States Patent
Tsai et al.

(10) Patent No.: US 8,278,761 B2
(45) Date of Patent: Oct. 2, 2012

(54) CIRCUIT LAYOUT STRUCTURE

(75) Inventors: Ching Long Tsai, Singapore (SG); Shi Jie Bai, Singapore (SG); Shan Liu, Singapore (SG); Yu Zhang, Singapore (SG)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 449 days.

(21) Appl. No.: 12/615,276

(22) Filed: Nov. 10, 2009

(65) Prior Publication Data

US 2011/0108991 A1    May 12, 2011

(51) Int. Cl.
*H01L 23/48* (2006.01)

(52) U.S. Cl. .. 257/773; 257/774; 257/775; 257/E23.011

(58) Field of Classification Search ............... 257/773, 257/774, 775, 510, E23.011
See application file for complete search history.

(56) References Cited

U.S. PATENT DOCUMENTS

| 6,103,619 A | 8/2000 | Lai |
| 6,444,574 B1 | 9/2002 | Chu |
| 2002/0163063 A1 | 11/2002 | Noguchi |
| 2010/0283128 A1 * | 11/2010 | Chen .......................... 257/620 |

* cited by examiner

*Primary Examiner* — Zandra Smith
*Assistant Examiner* — Paul Patton
(74) *Attorney, Agent, or Firm* — Winston Hsu; Scott Margo

(57) ABSTRACT

A circuit layout structure includes a metal interlayer dielectric layer surrounding a metal interconnect and a metal pattern within a scrub line. The scrub line is in the vicinity of the metal interlayer dielectric layer and the metal interconnect. The metal pattern or the metal interconnect are suitably segregated to reduce a capacitance charging effect.

13 Claims, 5 Drawing Sheets

CIRCUIT LAYOUT STRUCTURE

BACKGROUND OF THE INVENTION

1. Field of the Invention

The present invention generally relates to a circuit layout structure. In particular, the present invention relates to a special circuit layout structure. In this circuit layout structure, a metal interconnect which is surrounded by a metal interlayer dielectric layer and a metal pattern within a scrub line are suitably segregated to reduce an adverse capacitance charging effect.

2. Description of the Prior Art

In the semiconductor manufacturing processes, an etching step is usually employed to construct a pre-determined pattern in a pre-determined material layer. FIGS. 1-3 illustrate a process to construct a pre-determined pattern in a pre-determined material layer by a conventional etching step in the prior art. First, please refer to FIG. 1, a wafer 100 is provided. There are multiple material layers which have been constructed on the wafer 100. For example, an interlayer dielectric layer 110 is disposed on the silicon substrate 101, and a metal contact plug 111 is in the interlayer dielectric layer 110 and surrounded by the interlayer dielectric layer 110. A metal interlayer dielectric layer 120 is disposed on the metal contact plug 111 and covers the interlayer dielectric layer 110. An etching mask 130 is formed on the metal interlayer dielectric layer 120 and has a pre-determined pattern 131. The etching mask 130 may be a conductive mask of composite layers such as silicon oxynitride, conductive titanium nitride, tetraethoxysilane (TEOS) and/or a low-k material . . . etc.

Then, as shown in FIG. 2, a suitable etchant under a plasma circumstance is used to etch the underlying metal interlayer dielectric layer 120 to transfer the pre-determined pattern 131 into the metal interlayer dielectric layer 120 to form a trench 121 for defining metal wires and to expose the metal contact plug 111 in the interlayer dielectric layer 110, as shown in FIG. 2. The trench 121 which is formed by such etch step is useful in forming the electrical connection to the metal contact plug 111.

However, not all of the trenches 121 may successfully expose the metal contact plug 111 in the interlayer dielectric layer 110 as expected, as shown in FIG. 3. Sometimes, some charged etching residues 113, for example some polymers, cannot leave the trench 121 along with the suitable etchant under the plasma circumstance, hence too many etching residues 113 block the bottom of the trench 121 so that the metal contact plug 111 in the interlayer dielectric layer 110 cannot be exposed. This result is called an "opening failure."

One reason of the accumulation of the etching residues 113 is that, during the etching step, an ESD device (not shown) is often used to fix the wafer 100. Due to the static charge generated by the ESD device, an adverse capacitance through the induction of the substrate 101 may be formed between the conductive metal mask 130, such as a TiN mask, and the metal pattern 114 in the scrub line 103. As a result, this attracts more charged etching residues 113 to accumulate in the trench 121 in the chip region 102 and keeps the underlying metal contact plug 111 from being exposed. No effective electrical connection thus can be formed.

Accordingly, a novel circuit layout structure is still needed to improve the yield of the etching step, in particular to avoid too many etching residues blocking the trenches and failing to expose the underlying metal contact plugs when a metal interconnect is adjacent to a scrub line with a metal pattern.

SUMMARY OF THE INVENTION

The present invention therefore proposes a novel circuit layout structure to avoid too many etching residues blocking the trenches and failing to expose the underlying metal contact plug, in particular to avoid too many etching residues accumulating in the trenches which are about to become metal interconnects and failing to form an electrical connection between the metal interconnect and the underlying metal contact plug when the metal mask is adjacent to a scrub line with a metal pattern.

The present invention first provides a circuit layout structure including a metal interconnect, a metal interlayer dielectric layer, a scrub line, and a metal pattern. The metal interlayer dielectric layer surrounds the metal interconnect so that in a given section, the area of the metal interlayer dielectric layer is 9 times larger than the area of the metal interconnect. At the same time, the metal pattern is disposed within the scrub line and is adjacent to the metal interlayer dielectric layer and to the metal interconnect so that the scrub line is at least 250 μm away from the metal interconnect.

The present invention again provides a circuit layout structure including a metal interconnect, a metal interlayer dielectric layer, a scrub line, and a metal pattern. The metal interlayer dielectric layer surrounds the metal interconnect so that in a given section, the area of the metal interlayer dielectric layer is 9 times larger than the area of the metal interconnect. At the same time, the metal pattern is disposed within the scrub line, and in a given section which is adjacent to the metal interlayer dielectric layer and to the metal interconnect, the metal pattern is within the given section and the area of the metal pattern is smaller than quarter of that of the given section.

The present invention further proposes a circuit layout structure including a substrate, a shallow trench isolation, a metal pattern, a scrub line, and a metal interlayer dielectric. The shallow trench isolation is disposed in the substrate and the metal pattern in the scrub line is directly disposed on the shallow trench isolation so that the metal interlayer dielectric layer is disposed on the substrate and surrounds the metal interconnect.

The present invention proposes many circuit layout structures to suitably segregate the metal interconnect which is surrounded by the metal interlayer dielectric layer and the metal pattern within the scrub line to reduce an adverse capacitance charging effect between the metal mask and the adjacent metal pattern.

These and other objectives of the present invention will no doubt become obvious to those of ordinary skill in the art after reading the following detailed description of the preferred embodiment that is illustrated in the various figures and drawings.

DETAILED DESCRIPTION

The present invention provides multiple novel circuit layout structures. In the novel circuit layout structures provided by the present invention, a metal mask and a metal pattern within a scrub line can be suitably segregated to reduce an adverse capacitance charging effect between the metal mask and the adjacent metal pattern. Accordingly, the problem in which too many etching residues block the trenches, hinder the etching step and fail to expose the underlying metal contact plug can be avoided. In particular, when a metal mask is adjacent to a scrub line with a metal pattern, there is no too many etching residues accumulating in the trenches of the metal interlayer dielectric layer for defining the metal interconnect, so failing to form an electrical connection between the metal interconnect and the underlying metal contact plug can be avoided.

Figure 1:
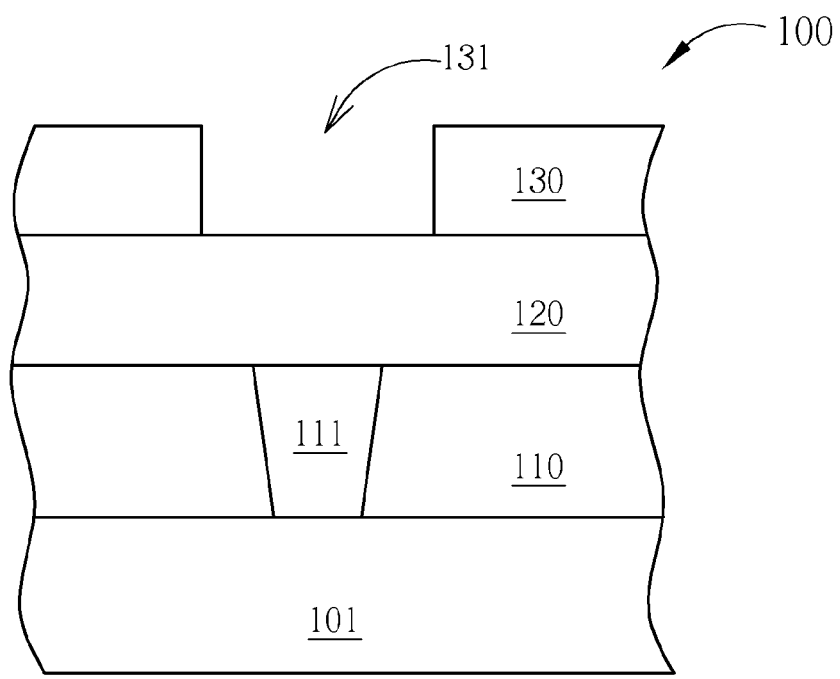
FIGS. 1-3 illustrate a process to construct a pre-determined pattern in a pre-determined material layer by a conventional etching step in the prior art.
Figure 2:
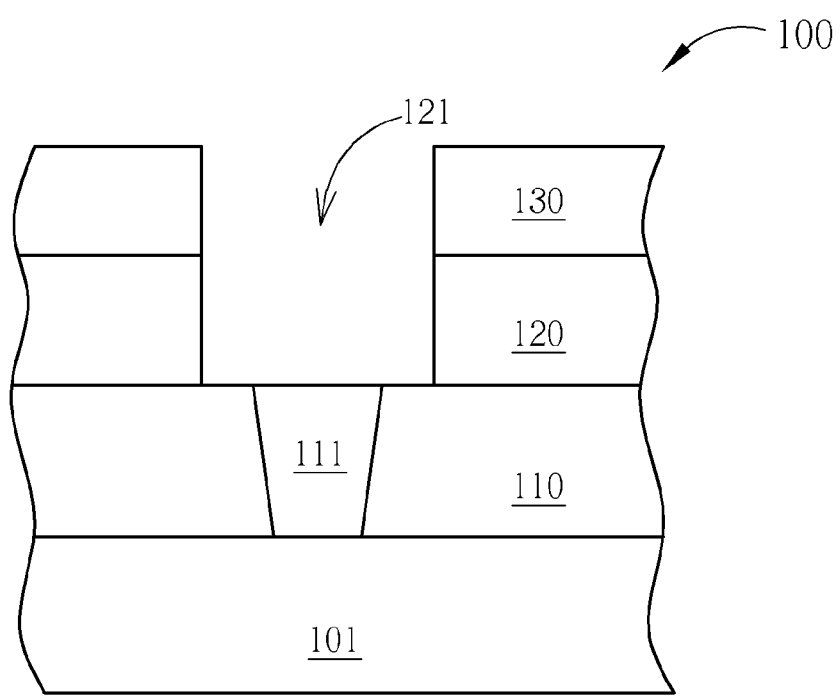
Figure 3:
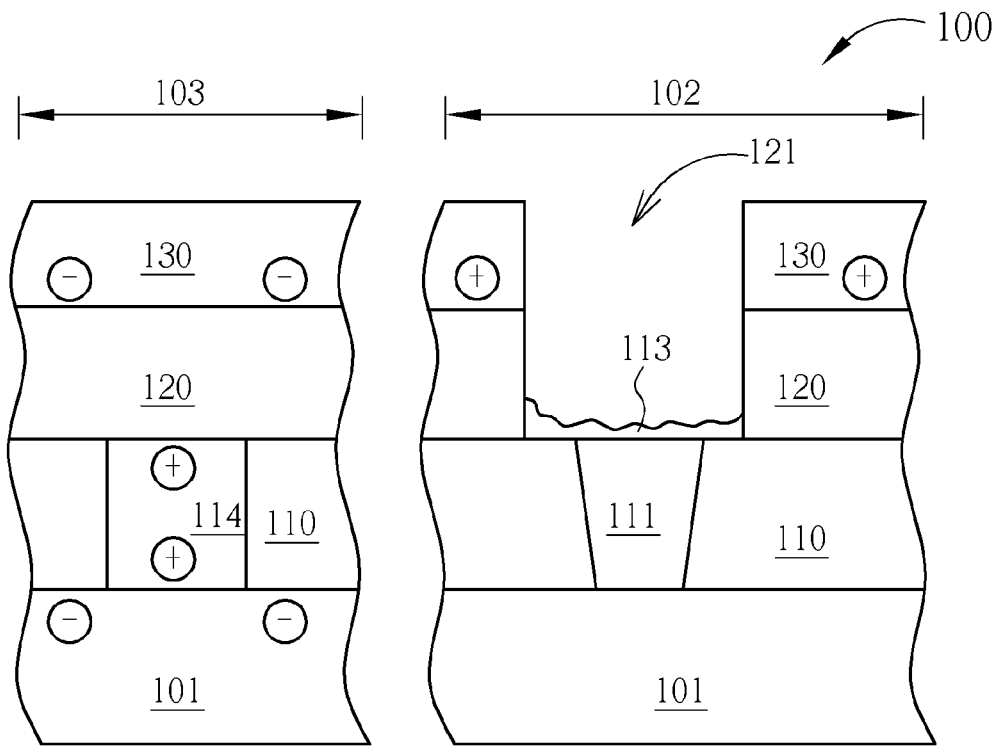
Figure 4A:
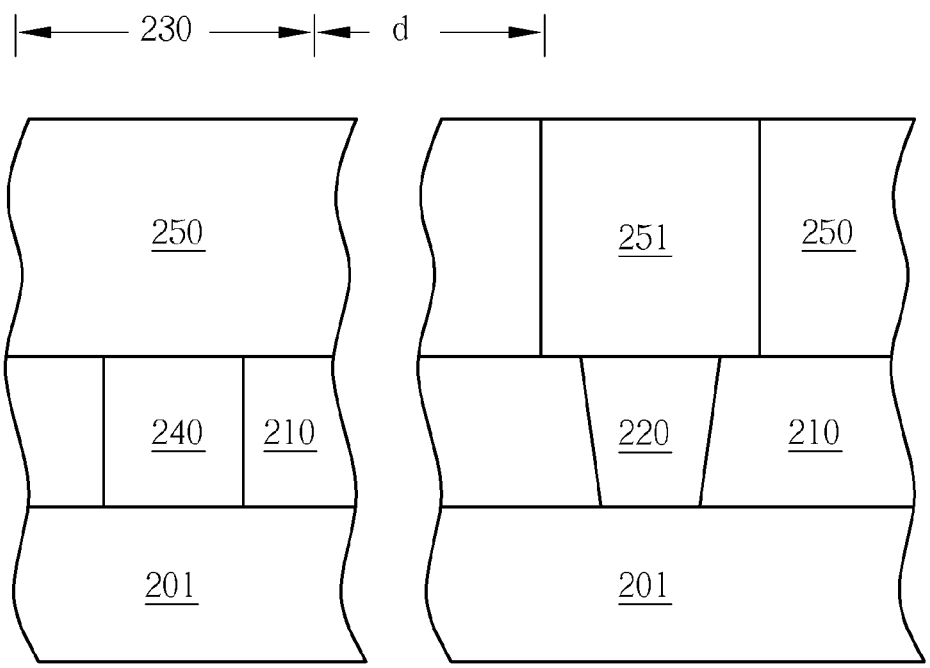
FIG. 4A illustrates a section view of the first embodiment of the circuit layout structure of the present invention.

FIG. 4A illustrates a section view of the first embodiment of the circuit layout structure of the present invention. In the first embodiment of the circuit layout structure of the present invention, the circuit layout structure 200 includes a substrate 201, an interlayer dielectric layer (ILD) 210, a metal contact plug 220, a scrub line 230, a metal pattern 240, a metal interlayer dielectric layer (IMD) 250 and a metal interconnect 251. The substrate 201 may be a semiconductor substrate such as Si. The metal interconnect 251 may be a damascene pattern, such as a single damascene pattern or a dual damascene and surrounded by the metal interlayer dielectric layer (IMD) 250.

In the circuit layout structure 200, the metal pattern 240 is disposed within the scrub line 230. The interlayer dielectric layer 210 is disposed on the substrate 210 and surrounds the metal pattern 240. The metal pattern 240 may include a metal such as W. Besides, the interlayer dielectric layer 210 and the metal interlayer dielectric layer 250 on the interlayer dielectric layer 210 may respectively include one or more dielectric materials, such as silicon oxide, silicon oxynitride, silicon nitride, tetraethoxysilane (TEOS) and a low-k material . . . etc.

Figure 4B:
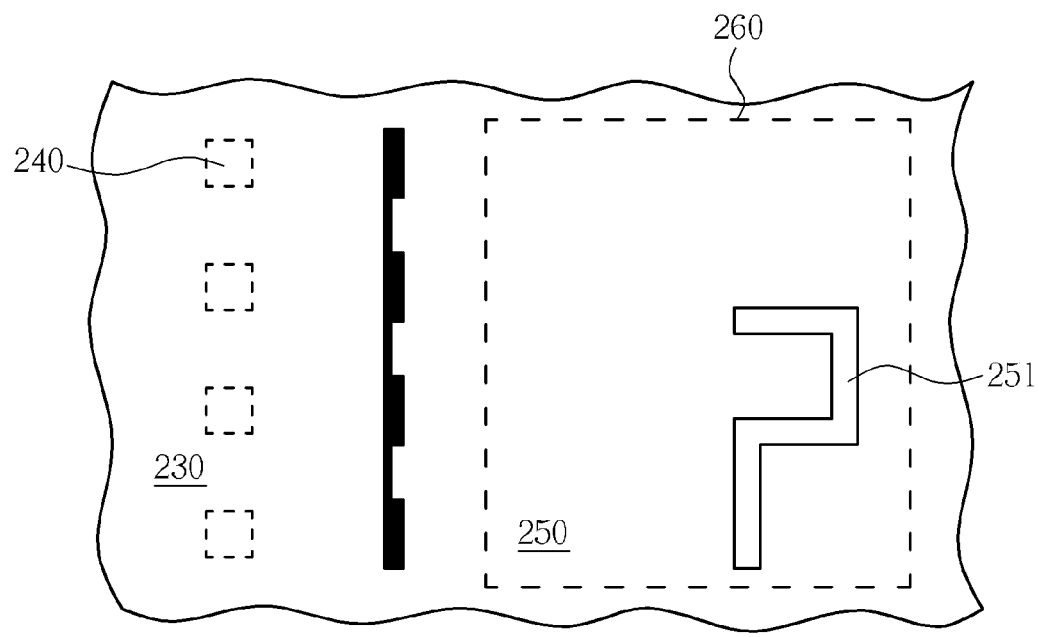
FIG. 4B illustrates a first embodiment of the circuit layout structure of the present invention.

Although the metal pattern 240 is disposed within the scrub line 230, the metal pattern 240 is also adjacent to the metal interlayer dielectric layer 250 and to the interlayer dielectric layer 210. One feature of the present invention is that there is only few the metal interconnect 251 disposed in the circuit layout structure. For example, as shown in FIG. 4B, in a given section 260, the area of the metal interlayer dielectric layer 250 is 9 times larger than the area of the metal interconnect 251. The given section 260 means a pre-determined section within the metal interlayer dielectric layer 250 and including the metal interconnect 251. Therefore, when forming the metal interconnect 251 by a traditional etching process, the metal mask would be large and a serious capacitance charging effect between the metal mask and metal pattern 240 will occur. As a result, the etching residues remind after etching.

To solve the problem, one of the features of the circuit layout structure of the present invention resides in that the metal interconnect 251 is so arranged that the distance 'd' of the metal interconnect 251 away from the scrub line 230 is at least 250 μm. In such a way, a sufficient distance may render the adverse capacitance charging effect as little as possible to influence the trench during the etching step, i.e. the metal interconnect 251 in FIG. 4A.

Figure 4C:
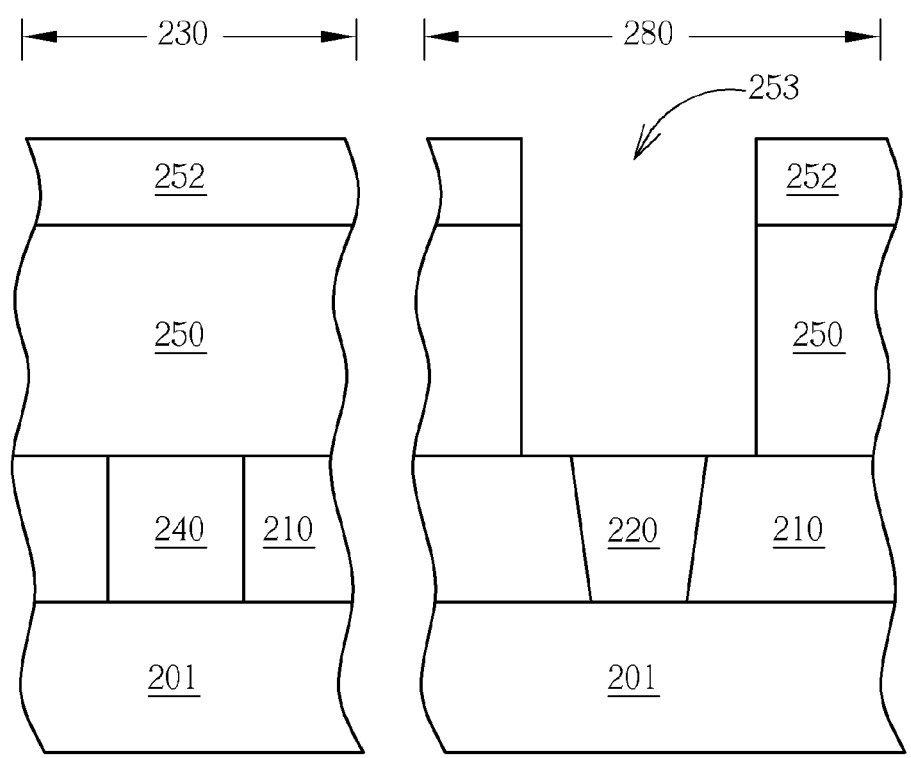
FIG. 4C illustrates a side view of the first embodiment of the etched circuit layout structure of the present invention.

Analysis shows that, as shown in FIG. 4C, if the metal mask 252 is in a chip region 280 which is adjacent to a scrub line 230 and there is a metal pattern 240, large or bulky W in particular, in the scrub line 230 which is adjacent to the metal mask 252 during the etching step, there is no too many etching residues accumulating at the bottom of the trench 253 so the metal contact plug 220 in the interlayer dielectric layer 210 can be exposed due to the above-mentioned structure design of the present invention.

Figure 5A:
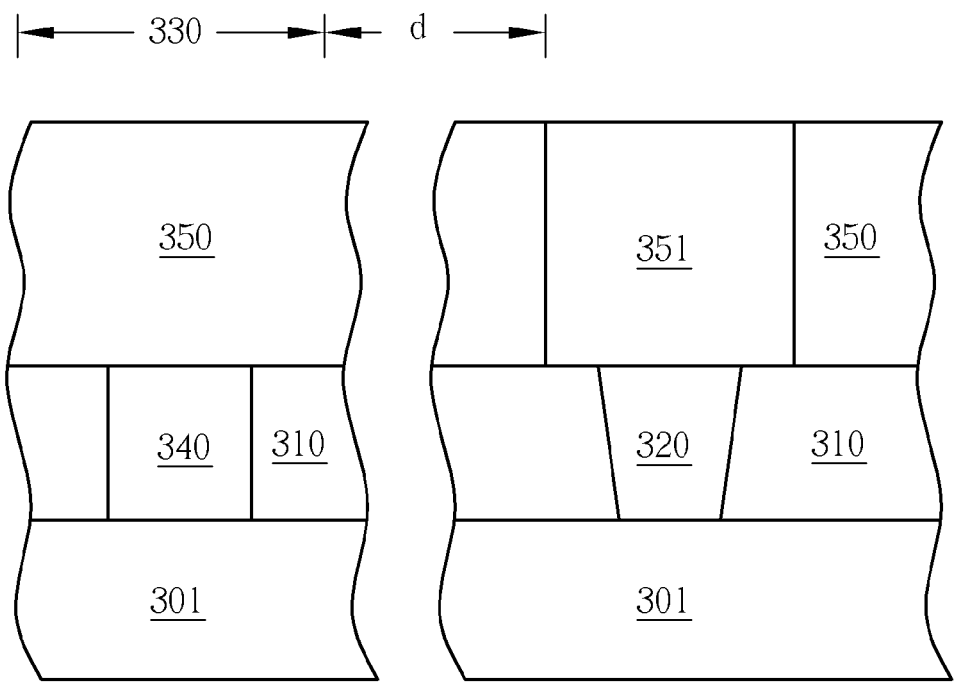
FIG. 5A illustrates a section view of the second embodiment of the circuit layout structure of the present invention.

Next, the present invention provides another circuit layout structure. FIG. 5A illustrates a section view of the second embodiment of the circuit layout structure of the present invention. In the second embodiment of the circuit layout structure of the present invention, the circuit layout structure 300 includes a substrate 301, an interlayer dielectric layer (ILD) 310, a metal contact plug 320, a scrub line 330, a metal pattern 340, a metal interlayer dielectric layer (IMD) 350 and a metal interconnect 351. The substrate 301 may be a semiconductor substrate such as Si. The metal interconnect 351 may be a damascene pattern, such as a single damascene pattern or a dual damascene and surrounded by the metal interlayer dielectric layer (IMD) 350.

In the circuit layout structure 300, the metal pattern 340 is disposed within the scrub line 330. The interlayer dielectric layer 310 respectively surrounds the metal contact plug 320 and the metal pattern 340. The metal pattern 340 may include a metal such as W. Besides, the interlayer dielectric layer 310 and the metal interlayer dielectric layer 350 may respectively include one or more dielectric materials, such as silicon oxide, silicon oxynitride, silicon nitride, tetraethoxysilane (TEOS) and a low-k material . . . etc.

Figure 5B:
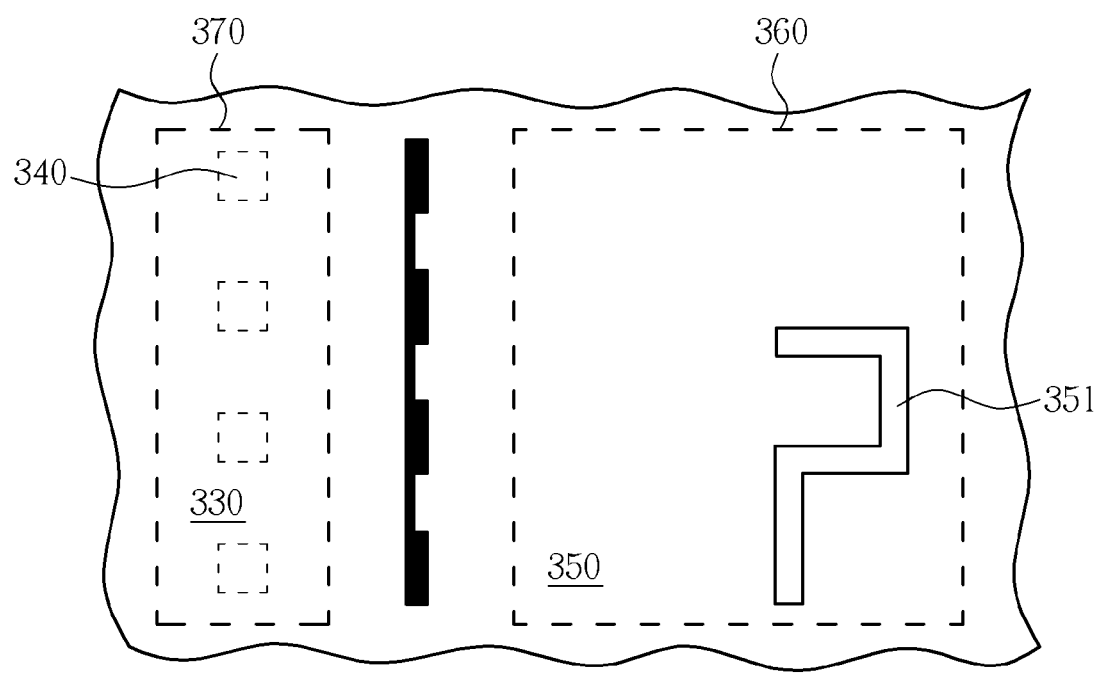
FIG. 5B illustrates a top view of the second embodiment of the circuit layout structure of the present invention.

Please refer to FIG. 5B, illustrating a top view of the second embodiment of the circuit layout structure of the present invention. The metal interlayer dielectric layer 350 surrounds the metal interconnect 351. The metal interconnect 351 is as a matter of fact a patterned metal layer which is formed by etching the metal interlayer dielectric layer 350 plus a metal deposition and a planarization by means of using a metal mask (not shown). The metal interconnect 351 has a crooked shape. The location of the metal pattern 340 is within the scrub line 330 and part of the metal pattern 340 may be adjacent to the metal interlayer dielectric layer 350 and the metal interconnect 351. One feature of the present invention is that there is only few the metal interconnect 351 disposed in the circuit layout structure. For example, as shown in FIG. 5B, in a given section 360, the area of the metal interlayer dielectric layer 350 is 9 times larger than the area of the metal interconnect 351. The given section 360 means a pre-determined section within the metal interlayer dielectric layer 350 and including the metal interconnect 351. The given section 360 is preferably in a rectangular shape. When forming metal interconnect 351 by a traditional etching process, the metal mask would be large and a serious capacitance charging effect between the metal mask and metal pattern 340 will occur. As a result, the etching residues remind after etching.

To solve the problem, the area of metal layer 340 occupied is lower down to decrease the capacitance charging effect. As shown in FIG. 5B, in a given section 370 which is adjacent to the metal interlayer dielectric layer 350 and to the metal interconnect 351, the metal pattern 340 is within the given section 370 and the area of the metal pattern 340 is by far smaller than that of the given section 370. In such a way, there is no too many metal patterns 340 in the given section 370 to form the adverse capacitance charging effect with the neighboring metal mask (not shown). Preferably, the area of the metal pattern 340 is smaller than or equals to quarter of that of the given section 370. The given section 370 means a pre-determined section including the metal pattern 340 (to be supplemented). The given section 370 is preferably in a rectangular shape.

Figure 5C:
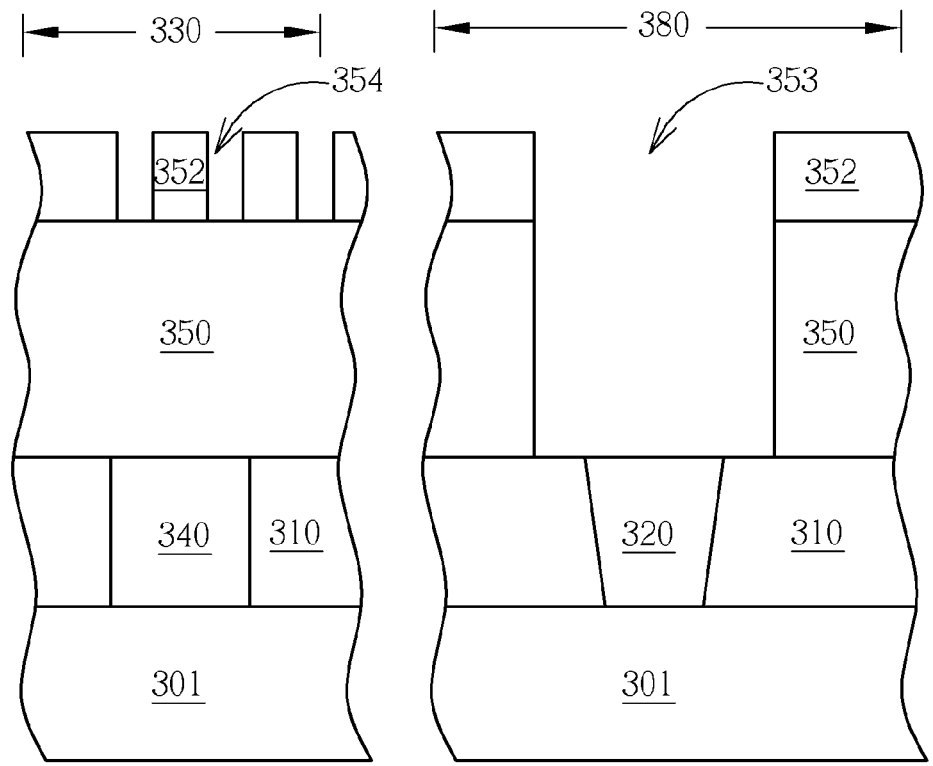
FIG. 5C illustrates a side view of a second embodiment of the circuit layout structure during etching of the present invention.

Analysis shows that, as shown in FIG. 5C, if the metal mask 352 is in a chip region 380 which is adjacent to a scrub line 330 and there is a metal pattern 340 in the scrub line 330 which is adjacent to the metal mask 352, there may be too many etching residues accumulating at the bottom of the trench 353 due to the aforesaid adverse capacitance charging effect. In the circuit layout structure of the present invention, there is no such problem and the metal contact plug 320 in the interlayer dielectric layer 310 can be exposed. Optionally, there are dummy rings 354 in the metal mask 352 around the scrub line 330 to reduce the above-mentioned inductive charges.

The metal pattern 340 may be any metal pattern, usually formed of a metal, within the scrub line 330. For example, the metal pattern 340 may be a contact alignment mark, a contact AIM mark, a SCM mark, an active area box logo, a critical dimension bar logo or other metal patterns made of metal, such as a cross shape pattern . . . etc. Many different ways may be used to reduce the area of the above-mentioned metal patterns.

For example, when there are many contact alignment marks present, for example 9 marks, the number of the contact alignment marks may be suitably reduced, for example from 9 marks to 7 marks, to reduce the total area of the contact alignment marks without adversely influencing the functions of the contact alignment marks. Or alternatively, marks may be totally removed. On the other hand, for the active area box logo and the critical dimension bar logo, the font size may be suitably reduced or a solid shape may be replaced by a dot pattern to reduce the total area of the marks. Still, for a cross shape pattern, a solid shape may be replaced by a hollow pattern to reduce the total area of the marks. In other words, many different ways may be employed to reduce the total area of the metal patterns as long as the functions of the marks are not adversely affected.

Figure 6:
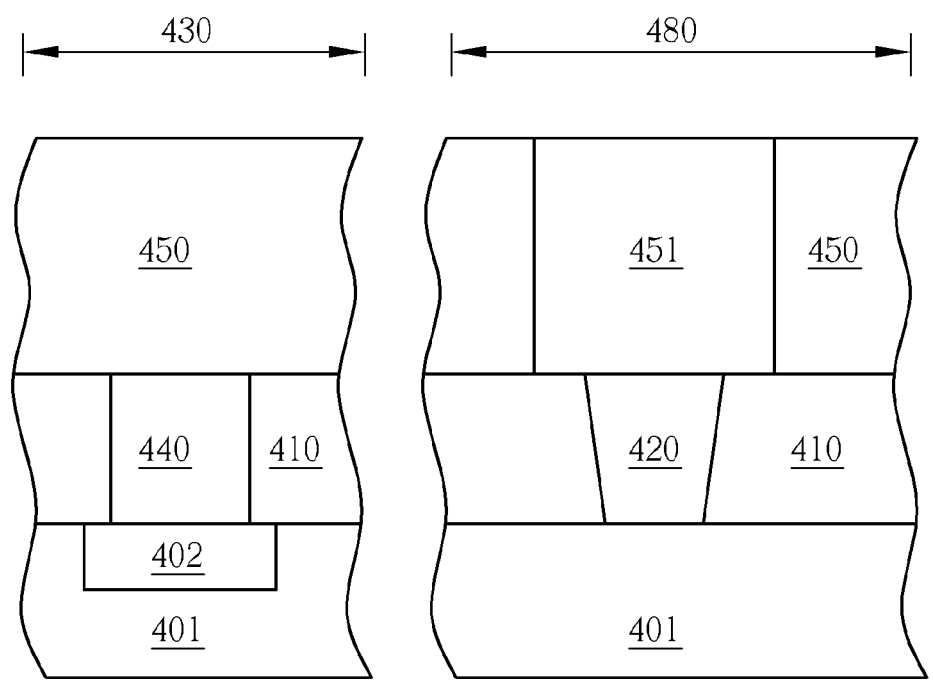
FIG. 6 illustrates a section view of the third embodiment of the circuit layout structure of the present invention.

The present invention further provides a circuit layout structure. FIG. 6 illustrates a section view of the third embodiment of the circuit layout structure of the present invention. In the third embodiment of the circuit layout structure of the present invention, the circuit layout structure 400 includes a substrate 401, a shallow trench isolation 402, an interlayer dielectric layer 410, a metal contact plug 420, a scrub line 430, and a metal pattern 440, a metal interlayer dielectric layer (IMD) 450 and a metal interconnect 451. The substrate 401 may be a semiconductor substrate, such as Si.

In the circuit layout structure 400, the shallow trench isolation 402 is disposed in the substrate 401. There is also the scrub line 430 in the circuit layout structure 400 and the metal pattern 440 disposed within the scrub line 430. The metal pattern 440 is directly disposed on the shallow trench isolation 402. The metal pattern 440 may include a metal such as W. The interlayer dielectric layer 410 is disposed on the substrate 401 and respectively surrounds the metal pattern 440 and the metal contact plug 420. The shallow trench isolation 402 may be formed by means of the conventional methods. All that needs to be done is to amend the reticle for constructing the shallow trench isolation 402, which makes the circuit layout structure 400 of the present invention compatible with the conventional semiconductor fabricating methods.

The metal interconnect 451 is disposed on the interlayer dielectric layer 410 and adjacent to the metal pattern 440. The metal interconnect 451 is also surrounded by the metal interlayer dielectric layer 450 in the same interlayer dielectric layer 410. The metal interconnect 451 and the metal interlayer dielectric layer 450 may together form a damascene pattern, such as a single damascene pattern or a dual damascene.

The interlayer dielectric layer 410 and the metal interlayer dielectric layer 450 may respectively include one or more dielectric materials, such as silicon oxide, silicon oxynitride, silicon nitride, tetraethoxysilane (TEOS) and a low-k material . . . etc. The metal contact plug 420 is disposed between the substrate 401 and the metal interconnect 451. The metal contact plug 420 is in direct contact with the metal interconnect 451.

Analysis shows that if the metal interconnect 451 in the metal interlayer dielectric layer 450 is in a chip region 480 which is adjacent to a scrub line 430 and there is a metal pattern 440 in the scrub line 430 which is adjacent to the metal interconnect 451, maybe due to the strongest capacitance charging effect, the metal contact plug 420 in the interlayer dielectric layer 410 cannot be exposed.

In addition, during the etching step, an ESD device (not shown) is often used to fix the wafer. Due to the static charge generated by the ESD device, an adverse capacitance through the induction of the substrate 401 may be formed between the conductive mask (not shown) and the metal pattern 440 which is within the scrub line 430, as a result, to attract more and more charged etching residues to accumulate in the trenches (not shown). Because the metal pattern 440 is directly disposed on the shallow trench isolation 402, the metal pattern 440 is less likely to be induced by the substrate 401 because of the isolation as well as the shielding of the shallow trench isolation 402 between the substrate 401 and the metal pattern 440.

In such a way, because of the electrical isolation of the shallow trench isolation 402, an adverse capacitance is less likely formed between the conductive mask (not shown) and the metal pattern 440 which is within the scrub line 430. Even though an adverse capacitance is formed between the conductive mask (not shown) and the metal pattern 440, the resultant capacitance charging effect is however minimal due to the thickness of the shallow trench isolation 402.

The present invention provides many circuit layout structures to reduce the adverse capacitance charging effect between the metal interconnect and the neighboring metal pattern. The circuit layout structures of the present invention are advantageous in increasing etching yield and avoiding the accumulation of etching residues as well as avoiding open failure.

Those skilled in the art will readily observe that numerous modifications and alterations of the device and method may be made while retaining the teachings of the invention.

What is claimed is:

1. A circuit layout structure comprising:
   a metal interconnect;
   a metal interlayer dielectric layer surrounding said metal interconnect, wherein in a given section the area of said metal interlayer dielectric layer is 9 times larger than the area of said metal interconnect;
   a scrub line disposed at least 250 μm away from said metal interconnect; and
   a metal pattern disposed within said scrub line and adjacent to said metal interlayer dielectric layer and to said metal interconnect.

2. The circuit layout structure of claim 1 having a damascene structure.

3. A circuit layout structure comprising:
   a metal interconnect;
   a metal interlayer dielectric layer surrounding said metal interconnect, wherein in a given section the area of said metal interlayer dielectric layer is 9 times larger than the area of said metal interconnect;

a scrub line adjacent to said metal interlayer dielectric layer and to said metal interconnect; and a metal pattern disposed within said scrub line, wherein in a given section which is adjacent to said metal interlayer dielectric layer and to said metal interconnect, said metal pattern is within said given section, and the area of said metal pattern is smaller than quarter of the area of said given section.

4. The circuit layout structure of claim 3 having a damascene structure.

5. The circuit layout structure of claim 3, wherein said metal interconnect has a crooked shape.

6. The circuit layout structure of claim 3, wherein said metal pattern comprises a hollow pattern.

7. The circuit layout structure of claim 3, wherein said metal pattern comprises a dot pattern.

8. The circuit layout structure of claim 3, wherein said given section is a rectangular shape.

9. A circuit layout structure comprising:
a substrate;
a shallow trench isolation disposed on said substrate;
a metal pattern disposed within a scrub line and directly disposed on said shallow trench isolation; and
an interlayer dielectric layer disposed on said substrate and surrounding said metal pattern.

10. The circuit layout structure of claim 9 further comprising:
a metal interconnect disposed on said interlayer dielectric layer and adjacent to said metal pattern; and
a metal interlayer dielectric layer disposed on said interlayer dielectric layer and surrounding said metal interconnect.

11. The circuit layout structure of claim 10, wherein said metal interconnect and said metal interlayer dielectric layer together form a damascene structure.

12. The circuit layout structure of claim 10, further comprising:
a metal contact plug disposed between said substrate and said metal interconnect and in direct contact with said metal interconnect.

13. The circuit layout structure of claim 9, wherein said shallow trench isolation segregates said substrate and said metal pattern.

* * * * *